United States Patent
Johnson et al.

(10) Patent No.: US 10,636,825 B2
(45) Date of Patent: Apr. 28, 2020

(54) SHAPED COLOR FILTER

(71) Applicant: Applied Materials, Inc., Santa Clara, CA (US)

(72) Inventors: Joseph R. Johnson, Redwood City, CA (US); Robert Jan Visser, Menlo Park, CA (US); Wayne McMillan, San Jose, CA (US); Rutger Meyer Timmerman Thijssen, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 140 days.

(21) Appl. No.: 15/647,349

(22) Filed: Jul. 12, 2017

(65) Prior Publication Data

US 2019/0019828 A1   Jan. 17, 2019

(51) Int. Cl.
 *H01L 21/00* (2006.01)
 *H01L 27/146* (2006.01)

(52) U.S. Cl.
 CPC .... *H01L 27/14621* (2013.01); *H01L 27/1463* (2013.01); *H01L 27/14623* (2013.01); *H01L 27/14625* (2013.01); *H01L 27/14627* (2013.01); *H01L 27/14645* (2013.01); *H01L 27/14685* (2013.01)

(58) Field of Classification Search
 CPC ......... H01L 27/14621; H01L 27/14623; H01L 27/14625; H01L 27/14627; H01L 27/1463; H01L 27/14645; H01L 27/14685
 See application file for complete search history.

(56) References Cited

U.S. PATENT DOCUMENTS

| | | | |
|---|---|---|---|
| 7,579,209 B2 | 8/2009 | Kim | |
| 9,343,490 B2 | 5/2016 | Yu et al. | |
| 9,653,501 B2 * | 5/2017 | Ungnapatanin | ... H01L 27/14621 |
| 2006/0138485 A1 * | 6/2006 | Jung | ............... H01L 27/14621 257/292 |
| 2008/0090323 A1 | 4/2008 | Wu | |
| 2010/0108866 A1 | 5/2010 | Tseng et al. | |
| 2015/0062390 A1 | 3/2015 | Kim et al. | |

FOREIGN PATENT DOCUMENTS

KR   20160106337 A   9/2016

OTHER PUBLICATIONS

International Search Report/Written Opinion dated Oct. 29, 2018 for Application No. PCT/US2018/041659.
Nano Lett. 2012, 12, 8, 4349-4354; Plasmonic Color Filters for CMOS Image Sensor Applications.

* cited by examiner

*Primary Examiner* — Richard A Booth
(74) *Attorney, Agent, or Firm* — Patterson + Sheridan, LLP

(57) ABSTRACT

Embodiments described herein generally relate to an apparatus for capturing an image and a photoactive device for that apparatus. In one embodiment, the apparatus for capturing an image includes a lens and a photoactive device. The photoactive device is positioned behind the lens. The photoactive device includes a substrate, one or more photodiodes, and a color filter array. The one or more photodiodes are formed in the substrate. The color filter array is positioned over the substrate. The color filter array has one or more color filters. Each color filter has a radiation receiving surface that is shaped to re-direct radiation to a respective photodiode.

14 Claims, 3 Drawing Sheets

SHAPED COLOR FILTER

BACKGROUND

Field

Embodiments of the present disclosure generally relates to a method and apparatus for capturing an image. More specifically, embodiments of the present disclosure relate to a photoactive device for an apparatus.

Description of the Related Art

An image sensor is a sensor that detects and conveys the information that constitutes an image. For example, an image sensor converts incoming radiation into signals that subsequently convey information. Image sensors may be used in electronic imaging devices such as digital cameras, camera modules, medical imaging equipment, and the like.

Color filters that are used in image sensors aid in selectively allowing a pre-defined wavelength of light to pass through, while blocking all other wavelengths of light. For example, color filter may be capable of resolving red, green, blue, and white light. In the case of red light, the respective red color filter will only allow for the red wavelength of light to pass through, while blocking the green, blue, and while light wavelengths.

Accordingly, there is a continual need to an improved image sensor in image capturing apparatuses.

SUMMARY

Embodiments described herein generally relate to an apparatus for capturing an image and a photoactive device for that apparatus. In one embodiment, the apparatus for capturing an image includes a lens and a photoactive device. The photoactive device is positioned behind the lens. The photoactive device includes a substrate, one or more photodiodes, and a color filter array. The one or more photodiodes are formed in the substrate. The color filter array is positioned over the substrate. The color filter array has one or more color filters. Each color filter has a radiation receiving surface that is shaped to re-direct radiation to a respective photodiode.

In another embodiment, a photoactive device is disclosed herein. The photoactive device includes a substrate, one or more photodiodes, and a color filter array. The one or more photodiodes are formed in the substrate. The color filter array is positioned over the substrate. The color filter array has one or more color filters. Each color filter has a radiation receiving surface that is shaped to re-direct radiation to a respective photodiode.

In another embodiment, a color filter array is disclosed herein. The color filter array includes a plurality of color filters. Each color filter has a radiation receiving surface and a radiation exiting surface. The radiation receiving surface of each filter is shaped to re-direct radiation entering the radiation receiving surface and exiting the radiation exiting surface.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
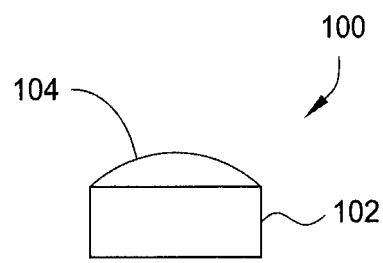
FIG. 1 illustrates a camera, according to one embodiment.

FIG. 1 is a schematic view of an apparatus 100 for capturing an image. In one example, the apparatus 100 may be a camera. In some examples, the camera may be for use in a mobile device. For example, the camera may be a rear-facing camera in a mobile device.

Camera 100 generally includes a photoactive device 102 and a lens 104. For example, the photoactive device 102 may be an image sensor. The photoactive device 102 is configured to capture an image in response to a user positioning the camera 100 in front of an object, and transmitting a signal to the camera 100 to, capture the image. The lens 104 may comprise one or more objective lenses. The one or more objective lenses are configured to aid in focusing on the object.

Figure 2A:
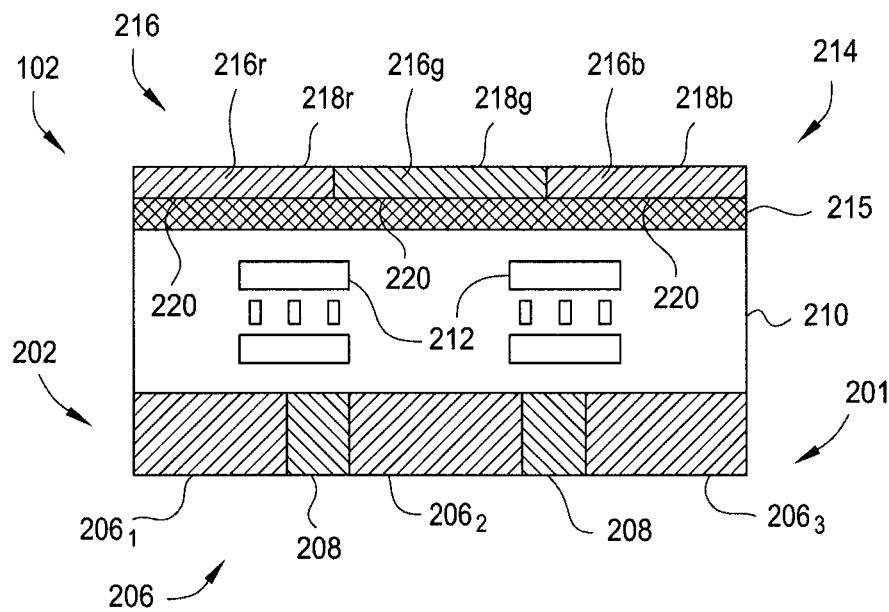
FIG. 2A illustrates a side cross sectional view of a photoactive device, according to one embodiment.

FIG. 2 is a side cross-sectional view of the photoactive device 102, according to one embodiment. The photoactive device 102 may comprise a photoactive feature 202. In one embodiment, the photoactive feature 202 may be an image sensor. In another embodiment, the photoactive feature 202 may be display pixels. For example, FIG. 2 illustrates a photoactive device 102 comprising a photoactive feature 202 that is a metal-oxide semiconductor (CMOS) image sensor.

The photoactive device 102 includes an array of photodiodes 206 formed in a substrate 201. For example, as illustrated, the photoactive device 102 includes three photodiodes $206_1$, $206_2$, $206_3$ (generically, $206_i$, although the number of photodiode $206_i$ may vary). In one embodiment, the substrate 201 may be formed of silicon. Alternatively, the substrate 201 may be formed of any suitable material, such as, but not limited to gallium arsenide, germanium, silicon-germanium, and the like. The substrate 201 may further include auxiliary circuitry 208 disposed therein. In one example, the substrate 201 may include auxiliary circuitry 208 between each photodiode $206_i$. For example, the substrate 201 includes auxiliary circuitry 208 between photodiode $206_1$ and $206_2$ and between photodiode $206_2$ and $206_3$.

The photoactive device 102 may further include a metal layer 210 positioned on a top surface of the substrate 201. The metal layer 210 may include one or more stacks of metal features 212. Each metal feature 212 may be aligned the photodiodes $206_1$. For example, as shown, a first stack of metal features 212 is shown overlapping with photodiodes $206_1$ and $206_2$, and a second stack of metal features 212 is shown overlapping with photodiodes $206_2$ and $206_3$. Each stack of metal features 212 may serve, for example as electrodes, guard rings, and light gates.

The photoactive device 102 may further include a color filter array 214 positioned on a top surface of the metal layer 210. The color filter array 214 comprises a plurality of color filters 216. For example, as illustrated in FIG. 2, the color filter array 214 includes a color filter $216_r$, $216_g$, and $216_b$ (generically, $216_i$). Each color filter $216_i$ is configured to receive radiation from a first surface (radiation receiving surface 218) and filter the radiation such each color filter $216_i$ only allows a pre-selected wavelength of light emitted from a second surface (radiation exiting surface 220) to pass through. For example, color filter $216_r$ is configured to only allow light corresponding to the red wavelength of light to pass therethrough. For example, color filter $216_g$ is configured to only allow light corresponding to the green wavelength of light to pass therethrough. For example, color filter $216_b$ is configured to only allow light corresponding to the blue wavelength of light to pass therethrough. In some embodiments, a coating layer 215 is positioned between the color filter array 214 and the metal layer 210 to protect the color filter array 214 from the metal layer 210.

In some techniques, a microlens array (MLA) (not shown) is used to aid in capturing a larger amount of radiation. The MLA is also used for directing the radiation towards the photodiode. For example, the MLA may be arranged such that the MLA directs light to each color filter $216_i$ positioned in the photoactive device 102. Directing the light towards each color filter $216_i$ aids in reducing the amount of light that may stray from the individual color filters $216_i$ and towards a light shield (e.g., a stack of metal features 212).

Embodiments of the photoactive device 102 do not implement, however, a traditional MLA. Rather, each color filter $216_i$ in the photoactive device 102 is shaped to aid in receiving a greater amount of radiation, and directing that radiation directly to a photodiode $206_i$, thus reducing or eliminating the need for an MLA. In one embodiment, the radiation receiving surface 218 of each color filter $216_i$ may be shaped to control the direction of radiation exiting the filed through the radiation exiting surface 220. For example, the radiation receiving surface 218 of each color filter $218_i$ may be shaped to re-direct the incoming radiation such that the radiation is directed towards a respective photodiode. Shaping the radiation receiving surface 218 means that an entirety of the radiation receiving surface 218 is not flat. In one embodiment, the radiation receiving surface 218 may be etched. For example, the radiation receiving surface 218 may be etched such that the color filter $216_i$ mimics a metalens comprising a plurality of nanofeatures.

Figure 3:
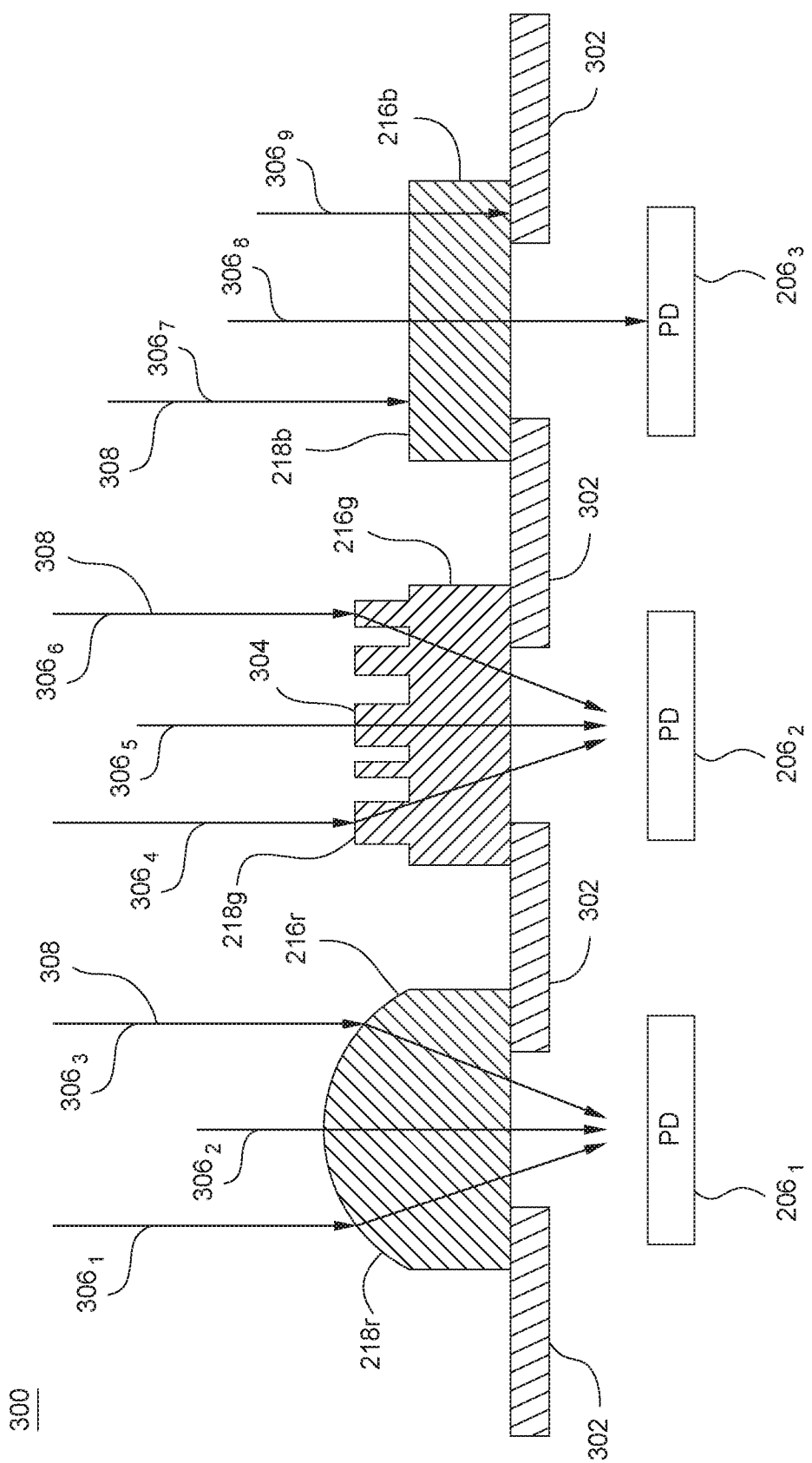
FIG. 3 is a logical diagram of the photoactive device of FIG. 2A, according to one embodiment.

FIG. 3 is a logical diagram 300 illustrating components of the photoactive device 102, according to one embodiment. Logical diagram 300 illustrates three color filters $216_r$, $216_g$, $216_b$. Below the color filters $216_i$ are one or more light shields 302. For example, the one or more light shields 302 may be a stack of metal features 212. As shown, each light shield 302 partially overlaps one or more color filters $216_i$. The light shields 302 are configured to shield light emitted from each color filter $216_i$ from mixing prior to reaching the photodiodes $206_i$ positioned thereunder.

As shown, each color filter $216_i$ includes a shaped radiation receiving surface $218_i$. For example, color filter $216_r$ has shaped radiation receiving surface $218_r$, color filter $216_g$ has shaped radiation receiving surface $218_g$, color filter $216_b$ has shaped radiation receiving surface $218_b$. In one embodiment, each radiation receiving surface $218_i$ may include the same patterning. In another embodiment, each radiation receiving surface $218_1$ may include a unique patterning. As discussed above, the patterning may be in a form that mimics a metalens. For example, as shown, radiation receiving surface $218_g$ is configured to be patterned such that it mimics a metalens comprising a plurality of nanofeatures. As shown, the radiation receiving surface $218_g$ includes a plurality of nanofeatures 304 etched therein.

In another embodiment, the shaped radiation receiving surface $218_i$ may mimic a microlens element in an MLA. For example, as illustrated, radiation receiving surface $218_r$ is shaped to mimic a microlens element, i.e., the radiation receiving surface $218_r$ has an arc shape. In another embodiment, the radiation receiving surface $218_i$ may be partially planarized. For example, as shown in radiation receiving surface $218_b$, the radiation receiving surface $218_b$ is planarized to form a flat polished surface.

Logical diagram 300 further illustrates radiation paths 306 of incoming radiation 308. For example, logical diagram 300 includes radiation paths $306_1$-$306_3$ passing through color filter $216_r$, radiation paths $306_4$-$306_6$ passing through color filter $216_g$, and radiation paths $306_7$-$306_9$ passing through color filter $216_b$. As shown, the radiation receiving surface $218_r$ is arc shaped, such that the color filter $216_r$ directs the radiation 308 towards the photodiode $206_1$. The radiation receiving surface $218_g$ mimicking a metalens directs the radiation 308 towards the photodiode $206_2$. The radiation receiving surface $218_b$ fails, however, in directing the radiation towards the photodiode $206_3$, as the radiation receiving surface $218_b$ is not shaped to change the direction of the radiation paths $306_7$-$306_9$. Accordingly, radiation 308 is lost as the light shield 302 absorbs the incoming radiation 308.

Thus, shaping the radiation receiving surfaces $218_i$ of each color filter $216_i$ enables the photoactive device 102 to receive a greater amount of radiation, while reducing the overall size of the photoactive device 102 with elimination of the need for an MLA.

Figure 2B:
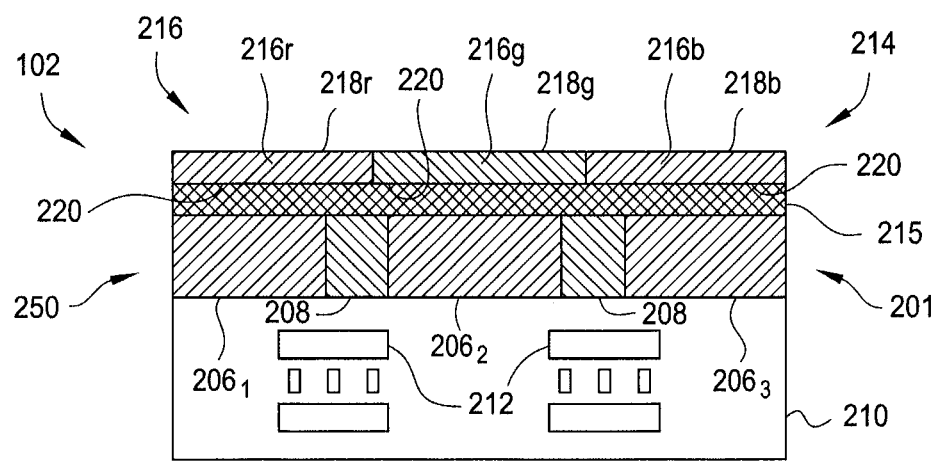
FIG. 2B illustrates a side cross sectional view of a photoactive device, according to one embodiment.

In some embodiments, as shown in FIG. 2B, the photoactive device 102 may include a back-illuminated image sensor 250. In this embodiment, the metal layer 210 having the one or more metal features 212 is positioned beneath the substrate 201. For example, the metal layer 210 is covered by the one or more photodiodes $206_1$-$206_3$.

Figure 4:
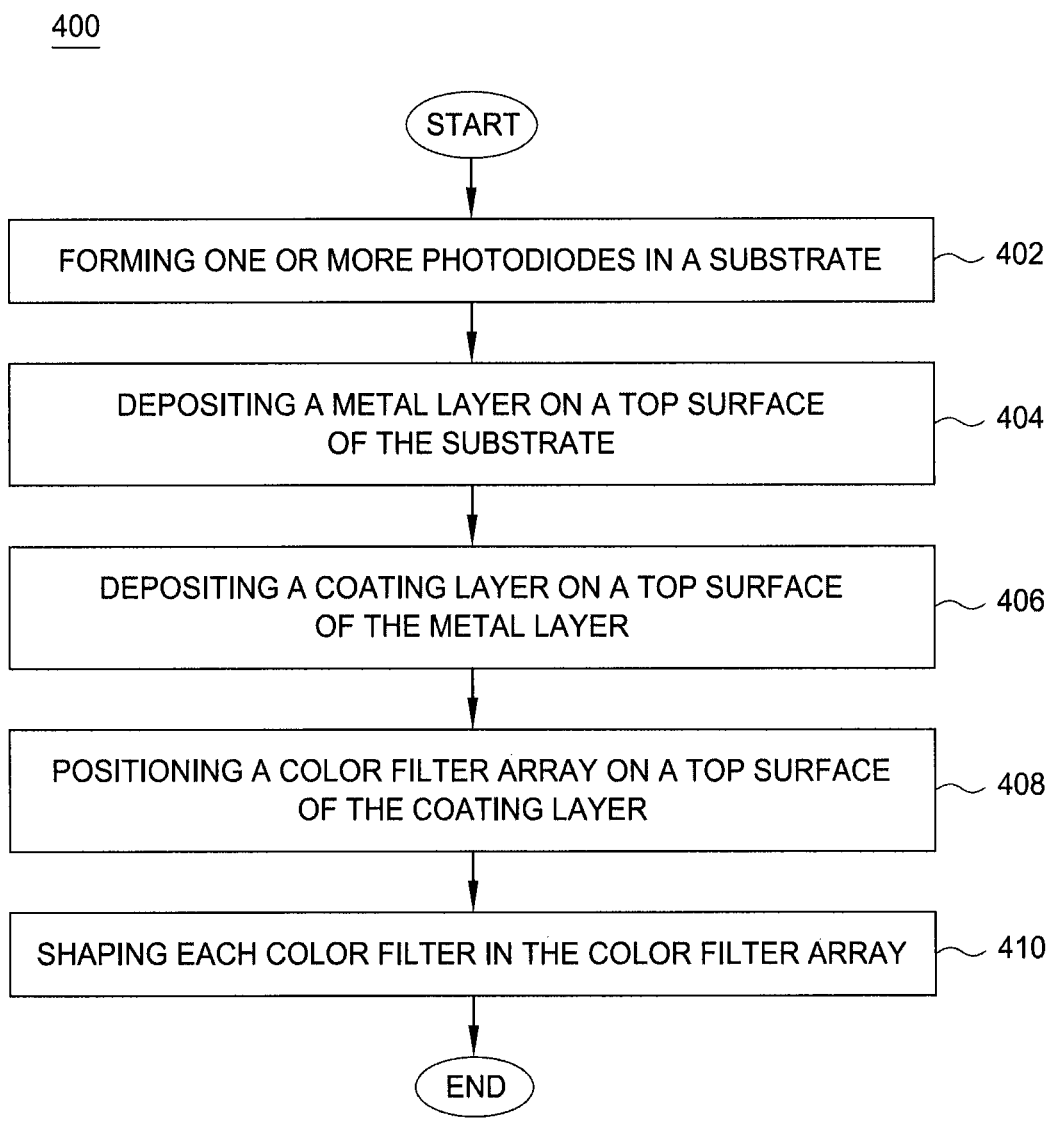
FIG. 4 is a flow diagram illustrating a method of forming a photoactive device, according to one embodiment.

FIG. 4 is a flow diagram illustrating a method 400 of forming a photoactive device, such as photoactive device 102, according to one example. The method 400 begins at block 402. At block 402 one or more photodiodes are formed on a substrate. For example, one or more photodiodes $216_i$ are formed on substrate 201. As illustrated in the above examples, photodiodes $216_1$-$216_3$ are formed on the substrate 201.

At block 404, a metal layer is deposited on a top surface of the substrate 201 having the one or more photodiodes formed thereon. For example, as illustrated above, metal layer 210 is deposited on substrate 201. The metal layer includes one or more metal features formed therein, At block 406, a coating layer may be deposited on a top surface of the metal layer. For example, referring to FIG. 2A above, coating layer 215 is deposited on the top surface of the metal layer 210. The coating layer 215 is configured to protect the color filters (positioned in block 408) from the underlying metal layer.

At block 408, a color filter array is positioned on a top surface of the coating layer 215. For example, color filter array 214 is positioned on the top surface of coating layer 215. The color filter array comprises a plurality of color filters. Each color filter 216 is configured to allow a pre-defined wave length of radiation to pass therethrough, while blocking all other wave lengths of radiation.

At block 410, each color filter in the color filter array is shaped. For example, each color filter may undergo a shaping process in which a radiation receiving surface of the color filter is shaped to help direct light towards one of the one or more photodiodes. In one embodiment, each color filter is shaped similarly. In another embodiment, each color filter has a unique shape. In yet another embodiment, two or more color filters may have the same shape. Shaping may be in the form of arcing, planarizing, etching, etc., of the radiation receiving surface of the color filter. For example, in one embodiment a shape of the radiation receiving surface 218 may be in the form of a metalens having a plurality of features etched therein. In another example, a shape of the radiation receiving surface 218 may be in the form of an arc. In yet another example, a shape of the radiation receiving surface 218 may be in the form of a partially planarized surface. Generally, a shape of the radiation receiving surface 218 may be any shape that re-directs incoming radiation.

While the foregoing is directed to embodiments of the present invention, other and further embodiments of the invention may be devised without departing from the basic scope thereof, and the scope thereof is determined by the claims that follow.

What is claimed is:

1. An apparatus for capturing an image, comprising:
    a lens; and
    a photoactive device positioned behind the lens, the photoactive device comprising:
        a substrate;
        three photodiodes formed in the substrate; and
        a color filter array positioned over the substrate, the color filter array having a plurality of color filters,
        wherein the plurality of color filters comprises three different color filters,
        wherein each different color filter has a radiation receiving surface having a unique patterning relative to the radiation receiving surfaces of the other color filters,
        wherein one radiation receiving surface is partially planarized and another radiation receiving surface is arc-shaped, and
        wherein each radiation receiving surface is shaped to re-direct radiation to a respective photodiode.

2. The apparatus of claim 1, wherein the photoactive device further comprises:
    a metal layer positioned between the substrate and the color filter array.

3. The apparatus of claim 2, wherein the metal layer comprises:
    one or more stacks of metal features shielding re-directed radiation from a first color filter from mixing with re-directed radiation from a second color filter.

4. The apparatus of claim 2, wherein the photoactive device further comprises:
    a coating layer positioned between the metal layer and the color filter array.

5. The apparatus of claim 1, wherein one color filter of the color filter array has one radiation receiving surface comprising a plurality of nanofeatures etched therein.

6. The apparatus of claim 1, wherein the lens comprises:
    one or more objective lenses.

7. A photoactive device, comprising:
    a substrate;
    three photodiodes formed in the substrate; and
    a color filter array positioned over the substrate, the color filter array comprising a plurality of color filters,
    wherein the plurality of color filters comprises three different color filters,
    wherein each different color filter has a radiation receiving surface having a unique patterning relative to the radiation receiving surfaces of the other color filters,
    wherein one radiation receiving surface is partially planarized and another radiation receiving surface is arc-shaped, and
    wherein each radiation receiving surface is shaped to re-direct radiation to a respective photodiode.

8. The photoactive device of claim 7 further comprising:
    a metal layer positioned between the substrate and the color filter.

9. The photoactive device of claim 8, wherein the metal layer comprises:
    one or more stacks of metal features shielding re-directed radiation from a first color filter from mixing with re-directed radiation from a second color filter.

10. The photoactive device of claim 8, further comprising:
    a coating layer positioned between the metal layer and the color filter array.

11. The photoactive device of claim 7, wherein one color filter of the color filter array has one radiation receiving surface comprising a plurality of nanofeatures etched therein.

12. A color filter array, comprising:
    a plurality of color filters,
        wherein the plurality of color filters comprises three different color filters, and each different color filter has a radiation receiving surface having a unique patterning relative to the radiation receiving surfaces of the other color filters,
        wherein one radiation receiving surface is partially planarized and another radiation receiving surface is arc-shaped, and
        wherein the radiation receiving surface of each different color filter is shaped to re-direct radiation entering the radiation receiving surface and exiting a radiation exiting surface on each different color filter.

13. The color filter array of claim 12, wherein one color filter of the plurality of color filters has a first radiation receiving surface comprising a plurality of nanofeatures etched therein.

14. The color filter array of claim 12, wherein each color filter is designated to allow a pre-defined wavelength of radiation to pass through, while blocking all other wavelengths of radiation.

* * * * *